US010034374B2

(12) United States Patent
Koide

(10) Patent No.: US 10,034,374 B2
(45) Date of Patent: Jul. 24, 2018

(54) DISPLAY DEVICE

(71) Applicant: Japan Display Inc., Minato-ku (JP)

(72) Inventor: Gen Koide, Tokyo (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/661,128

(22) Filed: Jul. 27, 2017

(65) Prior Publication Data

US 2018/0035540 A1 Feb. 1, 2018

(30) Foreign Application Priority Data

Jul. 29, 2016 (JP) ................. 2016-149578

(51) Int. Cl.
*H05K 1/11* (2006.01)
*H05K 1/14* (2006.01)
*G02F 1/1333* (2006.01)
*G02F 1/1368* (2006.01)
*G02F 1/1362* (2006.01)
(Continued)

(52) U.S. Cl.
CPC ........... *H05K 1/115* (2013.01); *G02F 1/1339* (2013.01); *G02F 1/1368* (2013.01); *G02F 1/13338* (2013.01); *G02F 1/13394* (2013.01); *G02F 1/13439* (2013.01); *G02F 1/133345* (2013.01); *G02F 1/133512* (2013.01); *G02F 1/133514* (2013.01); *G02F 1/134309* (2013.01); *G02F 1/136286* (2013.01); *H05K 1/144* (2013.01); *G02F 2201/121* (2013.01); *G02F 2201/123* (2013.01); *G02F 2201/124* (2013.01); *G06F 3/044* (2013.01); *G06F 3/0412* (2013.01); *H05K 2201/10136* (2013.01)

(58) Field of Classification Search
CPC ........... G02F 1/133345; G02F 1/13338; G02F 1/133512; G02F 1/133514; G02F 1/1339; G02F 1/13394; G02F 1/134309; G02F 1/13439; G02F 1/136286; G02F 1/1368; G02F 2201/121; G02F 2201/123; G02F 2201/124

See application file for complete search history.

(56) References Cited

U.S. PATENT DOCUMENTS

2011/0242469 A1* 10/2011 Kawamura ....... G02F 1/133512
349/138
2014/0022478 A1* 1/2014 Kim ..................... G02F 1/1339
349/43
(Continued)

FOREIGN PATENT DOCUMENTS

JP 2002-040465 2/2002

*Primary Examiner* — Yuriy Semenenko
(74) *Attorney, Agent, or Firm* — Oblon, McClelland, Maier & Neustadt, L.L.P.

(57) ABSTRACT

According to one embodiment, a display device includes a first substrate including a first basement and a first conductive layer, a second substrate including a second basement which includes a first surface and a second surface, and a second conductive layer which is located on the second surface, and including a first hole which penetrates between the first surface and the second surface, a first light-shielding layer located between the first basement and the second basement, and a connecting material electrically connecting the first and second conductive layer via the first hole, wherein the connecting material and the first light-shielding layer are spaced apart from each other.

20 Claims, 11 Drawing Sheets

(51) Int. Cl.
  *G02F 1/1343*  (2006.01)
  *G02F 1/1335*  (2006.01)
  *G02F 1/1339*  (2006.01)
  G06F 3/041    (2006.01)
  G06F 3/044    (2006.01)

(56) References Cited

U.S. PATENT DOCUMENTS

| | | | |
|---|---|---|---|
| 2014/0043574 A1* | 2/2014 | Ichimura | G02F 1/1339 349/138 |
| 2014/0092351 A1* | 4/2014 | Hatakeyama | G02F 1/1339 349/106 |
| 2015/0162357 A1* | 6/2015 | Miyanaga | H01L 27/1222 257/72 |
| 2016/0284735 A1* | 9/2016 | Anjo | G02F 1/134363 |
| 2017/0269437 A1* | 9/2017 | Chen | G02F 1/134309 |
| 2018/0031939 A1* | 2/2018 | Imazeki | G02F 1/136286 |
| 2018/0035542 A1* | 2/2018 | Osawa | H05K 1/144 |

* cited by examiner

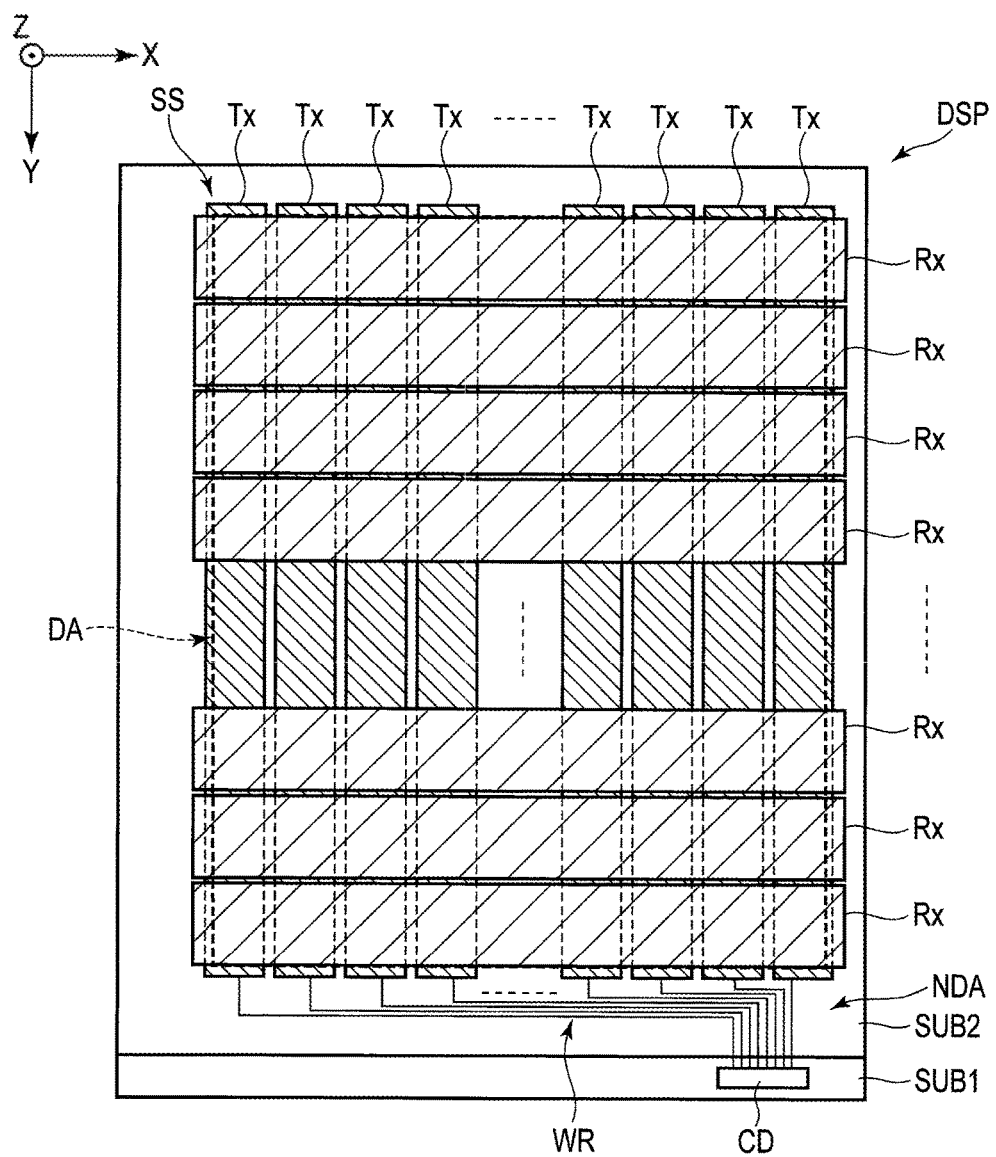
F I G. 4

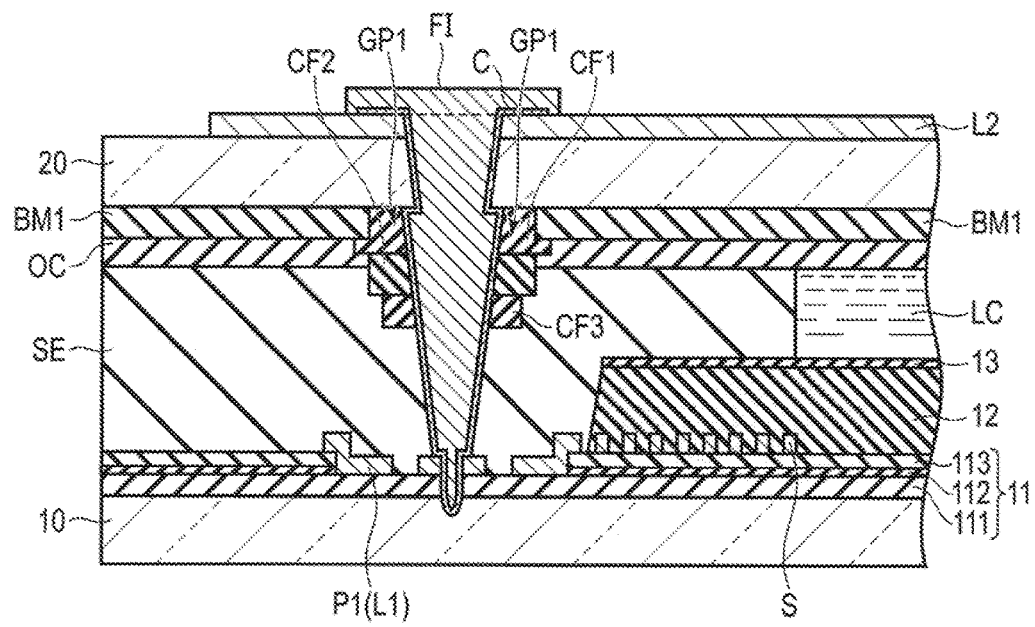
F I G. 7
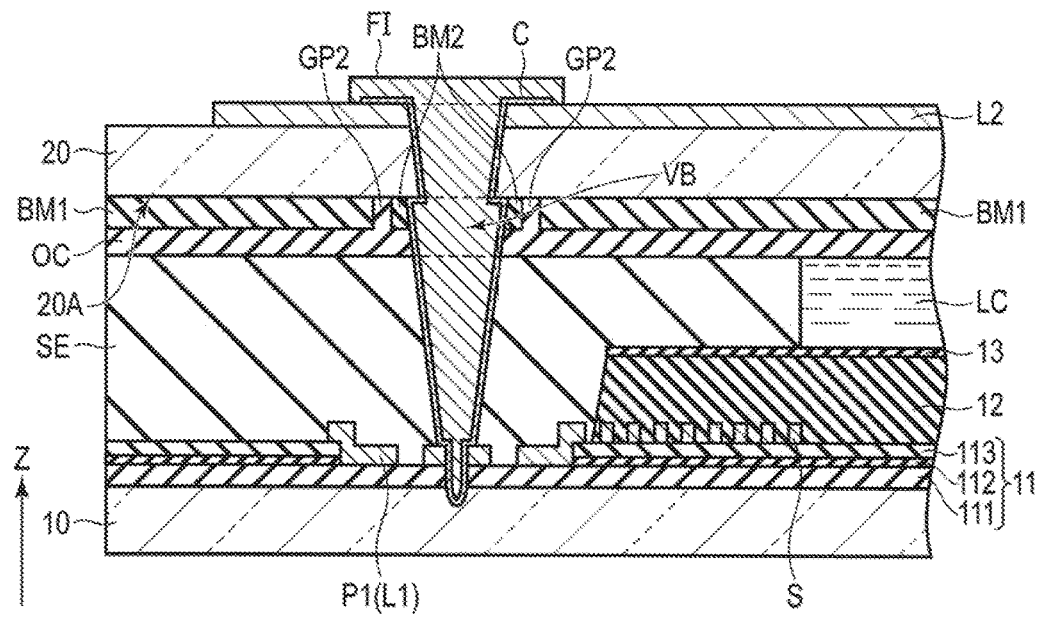
F I G. 8

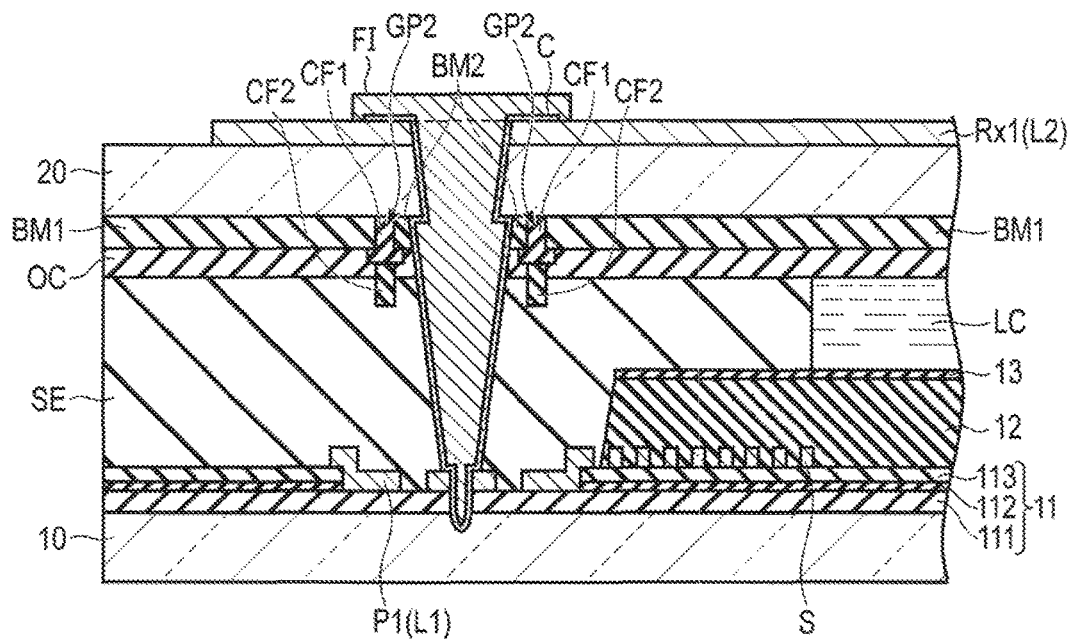
F I G. 9
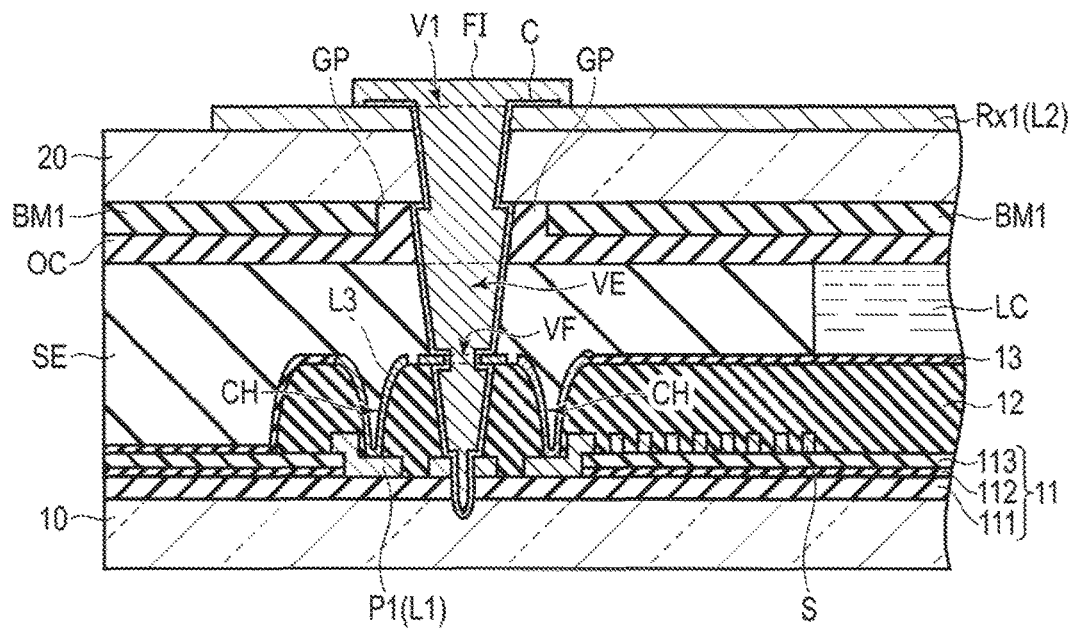
F I G. 10

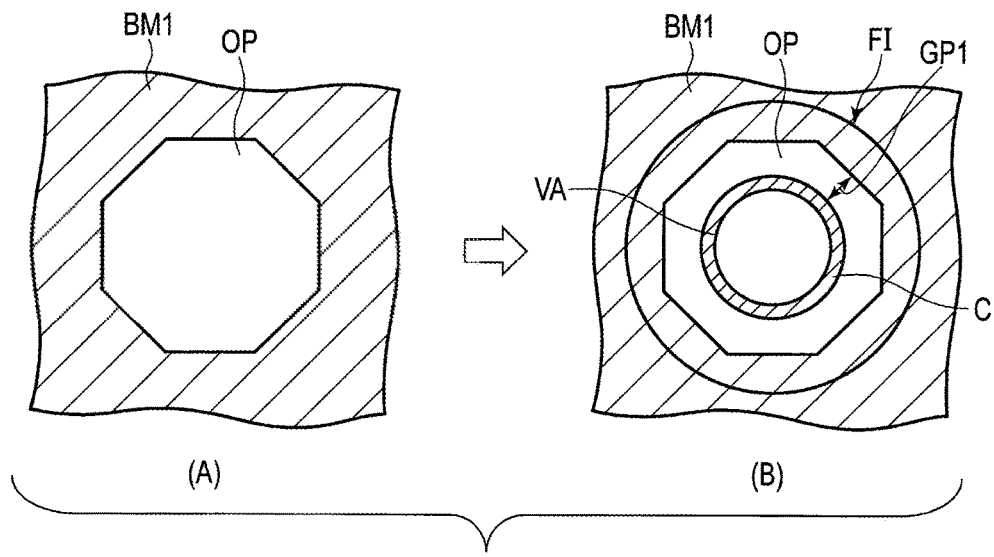
F I G. 13
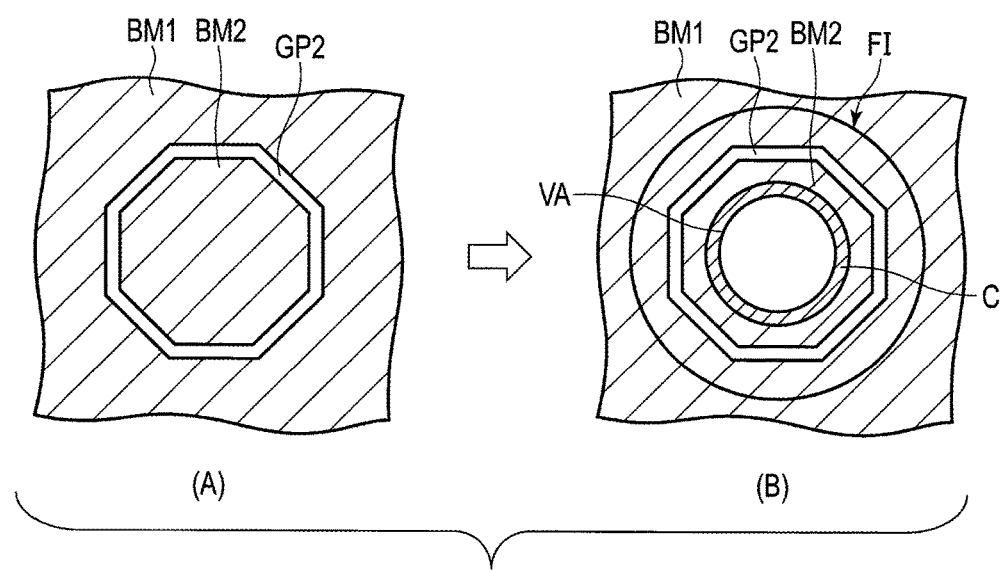
F I G. 14

DISPLAY DEVICE

CROSS-REFERENCE TO RELATED APPLICATIONS

This application is based upon and claims the benefit of priority from Japanese Patent Application No. 2016-149578, filed Jul. 29, 2016, the entire contents of which are incorporated herein by reference.

FIELD

Embodiments described herein relate generally to a display device.

BACKGROUND

Recently, various techniques for narrowing the frame of a display device have been considered. For example, a technology of electrically connecting a line portion including an in-hole connector in a hole penetrating an inner surface and an outer surface of a first substrate formed of resin with a line portion provided on an inner surface of a second substrate formed of resin, by an inter-substrate connecting portion, has been disclosed.

BRIEF DESCRIPTION OF THE DRAWINGS

FIG. 4 is a plan view showing a configuration example of a sensor.

FIG. 7 is a cross-sectional view showing another example of the display panel cut along line A-B including the contact hole shown in FIG. 1.

FIG. 8 is a cross-sectional view showing another example of the display panel cut along line A-B including the contact hole shown in FIG. 1.

FIG. 9 is a cross-sectional view showing yet another example of the display panel cut along line A-B including the contact hole shown in FIG. 1.

FIG. 10 is a cross-sectional view showing yet another example of the display panel cut along line A-B including the contact hole shown in FIG. 1.

FIG. 13 is a plan view showing a positional relationship between a light-shielding layer and a hole shown in FIG. 6.

FIG. 14 is a plan view showing a positional relationship between a light-shielding layer and a hole shown in FIG. 8.

DETAILED DESCRIPTION

Figure 1:
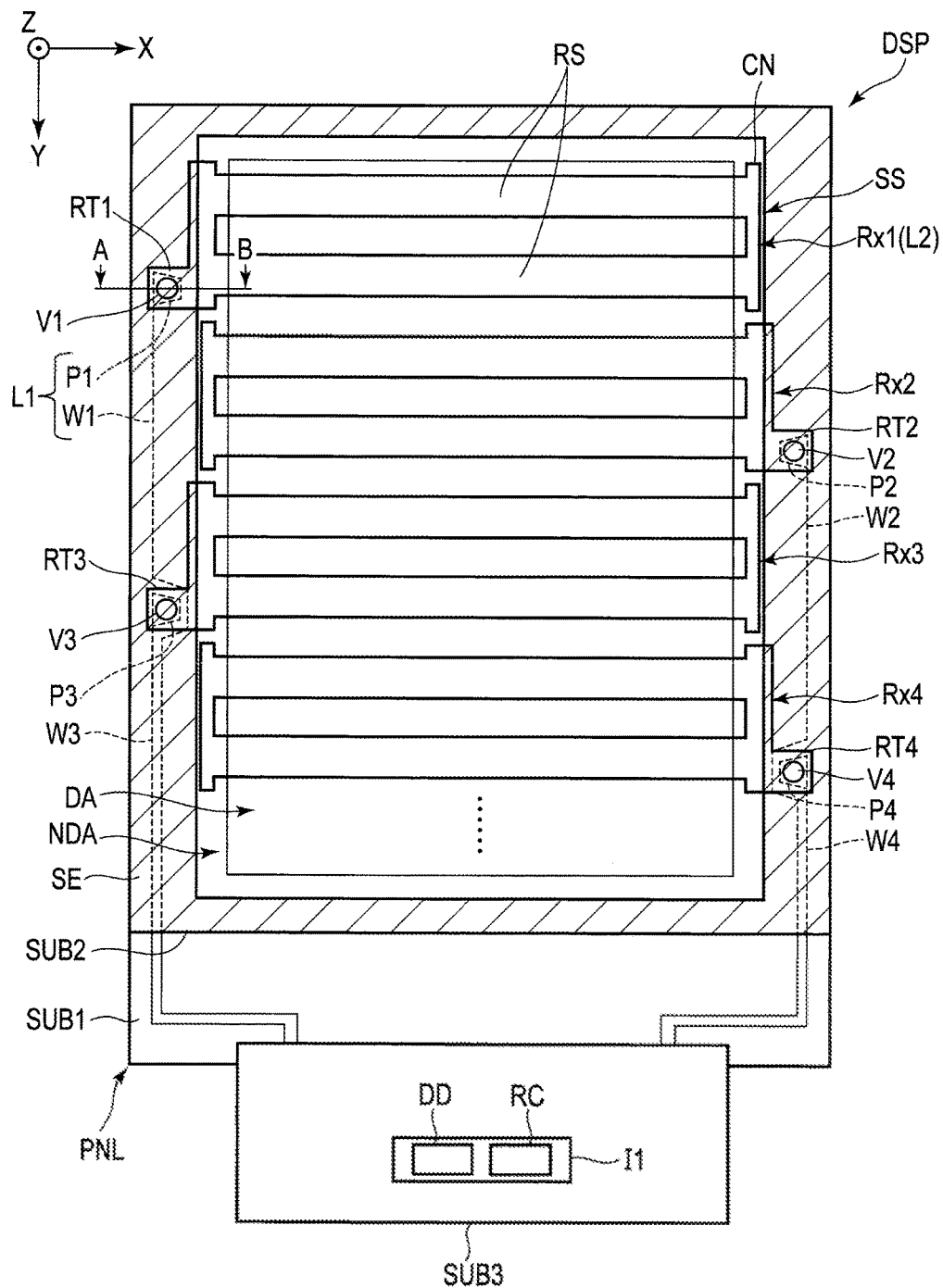
FIG. 1 is a plan view showing a configuration example of the display device of the embodiments.

In general, according to one embodiment, a display device comprising: a first substrate comprising a first basement and a first conductive layer; a second substrate comprising a second basement which includes a first surface opposed to the first conductive layer and spaced apart from the first conductive layer and a second surface on a side opposite to the first surface, and a second conductive layer which is located on the second surface, and including a first hole which penetrates between the first surface and the second surface; a first light-shielding layer located between the first basement and the second basement; and a connecting material electrically connecting the first conductive layer with the second conductive layer via the first hole, wherein the connecting material and the first light-shielding layer are spaced apart from each other.

Embodiments will be described hereinafter with reference to the accompanying drawings. Incidentally, the disclosure is merely an example, and proper changes within the spirit of the invention, which are easily conceivable by a skilled person, are included in the scope of the invention as a matter of course. In addition, in some cases, in order to make the description clearer, the widths, thicknesses, shapes, etc., of the respective parts are schematically illustrated in the drawings, compared to the actual modes. However, the schematic illustration is merely an example, and adds no restrictions to the interpretation of the invention. Besides, in the specification and drawings, the structural elements having functions, which are identical or similar to the functions of the structural elements described in connection with preceding drawings, are denoted by like reference numerals, and an overlapping detailed description is omitted unless otherwise necessary.

In the embodiments, a display device is disclosed as an example of the electronic device. This display device can be used in various devices such as smartphones, tablet terminals, mobile telephones, notebook computers, and game consoles. The major configuration explained in the embodiments can be applied to a liquid crystal display device, a self-luminous display device such as an organic electroluminescent display device, an electronic paper display device comprising an electrophoretic element and the like, a display device employing micro-electromechanical systems (MEMS), or a display device employing electrochromism.

FIG. 1 is a plan view showing a configuration example of a display device DSP according to the embodiments. A liquid crystal display device equipped with a sensor SS will be explained as an example of the display device DSP.

A first direction X, a second direction Y, and a third direction Z are orthogonal to each other but may intersect at an angle other than ninety degrees. The first direction X and the second direction Y correspond to the directions parallel to the surface of a substrate which constitutes the display device DSP, and the third direction Z corresponds to the thickness direction of the display device DSP. A plane of the display device DSP in an X-Y plane defined by the first direction X and the second direction Y is illustrated.

The display device DSP comprises a display panel PNL, an IC chip I1, a wiring substrate SUB3 and the like. The display panel PNL is a liquid crystal display panel, and includes the first substrate SUB1, the second substrate SUB2, a sealant SE, and a display function layer (a liquid crystal layer LC which will be described later). The second substrate SUB2 is opposed to the first substrate SUB1. The sealant SE corresponds to a part indicated by upward-sloping hatch lines in FIG. 1, and bonds the first substrate SUB1 and the second substrate SUB2 to each other.

The display panel PNL includes a display area DA on which an image is displayed and a frame-shaped non-display area NDA surrounding the display area DA. The sealant SE is located in the non-display area NDA, and the display area DA is located on the inner side surrounded by the sealant SE.

A wiring substrate SUB3 is mounted on the first substrate SUB1. The wiring substrate SUB3 is, for example, a flexible substrate having flexibility. A flexible substrate applicable to the present embodiments may comprise a flexible part formed of a flexible material as at least a part of the substrate. For example, the wiring substrate 3 of the present embodiments may be a flexible substrate entirely configured as a flexible part or a rigid-flexible substrate comprising a rigid part formed of a hard material such as glass epoxy and a flexible part formed of a flexible material such as polyimide.

The IC chip I1 is mounted on the wiring substrate SUB3. The IC chip I1 is not limited to the example illustrated, but may be mounted on the first substrate SUB1 extending to an outside of the second substrate SUB2 or mounted on an external circuit substrate connected to the wiring substrate SUB3. The IC chip I1 incorporates, for example, a display driver DD which outputs a signal necessary to display an image. The display driver DD includes at least several parts of a signal line drive circuit SD, a scanning line drive circuit GD, and a common electrode drive circuit CD, which will be described later. In the example illustrated, the IC chip I1 incorporates a detection circuit RC which functions as a touch panel controller or the like. The detection circuit RC may be incorporated in the other IC chip different from the IC chip I1.

The display panel PNL may be, for example, a transmissive display panel having a transmissive display function of displaying an image by urging the light from the lower side of the first substrate SUB1 to be selectively transmitted, a reflective display panel having a reflective display function of displaying an image by urging the light from the upper side of the second substrate SUB2 to be selectively transmitted, or a transflective display panel having the transmissive display function and the reflective display function.

The sensor SS executes sensing to detect contact of an object with the display device DSP or approach of an object to the display device DSP. The sensor SE comprises a plurality of detection electrodes Rx (Rx1, Rx2, . . . ) The detection electrodes Rx are disposed on the second substrate SUB2. In the present embodiments, the detection electrodes Rx corresponds to a second conductive layer L2 disposed on the second substrate SUB2. The detection electrodes Rx extend in the first direction X, and are arranged in the second direction Y so as to be spaced apart from each other.

FIG. 1 illustrates detection electrodes Rx1 to Rx4 as the detection electrodes Rx, but a structural example of the detection electrode Rx1 will be specifically explained. The detection electrode Rx1 comprises detectors RS, a terminal RT1 and a connector CN.

The detectors RS are located in the display area DA and extend in the first direction X. In the detection electrode Rx1, the detectors R are primarily used for sensing. In the example illustrated, each detector RS is formed in a strip shape and, more specifically, formed of an assembly of fine metal wires as explained with reference to FIG. 5. One detection electrode Rx1 comprises two detectors RS but may comprise three or more detectors RS or one detector RS.

The terminal RT1 is located on one end side of the non-display area NDA in the first direction X and connected to the detectors RS. The connector CN is located on the other end side of the non-display area NDA in the first direction X to connect the detectors RS with each other. In FIG. 1, the one end side corresponds to the left side of the display area DA and the other end side corresponds to the right side of the display area DA. The terminal RT1 is partially formed at a position at which the terminal RT1 and the sealant SE overlap each other in planar view.

In contrast, the first substrate SUB1 comprises a pad P1 and a wiring line W1 electrically connected with the wiring substrate SUB3. In the present embodiments, the pad P1 and the wiring line W1 are considered as a first conductive layer L1 disposed on the first substrate SUB1. The pad P1 and the wiring line W1 are disposed on one end side of the non-display area NDA and overlap the sealant SE in planar view. The pad P1 is formed at a position at which the pad P1 and the terminal RT1 overlap each other in planar view. The wiring line W1 is connected to the pad P1 to extend in the second direction Y, and is electrically connected with the detection circuit RC of the IC chip I1 via the wiring substrate SUB3.

A contact hole V1 is formed at a position at which the terminal RT1 is opposed to the pad P1. The contact hole V1 penetrates the second substrate SUB2 including the terminal RT1 and the sealant SE. The contact hole V1 may penetrate the pad P1. As explained later, a connecting material C having conductivity is provided in the contact hole V1. The terminal RT1 is thereby electrically connected to the pad P1. In other words, the detection electrode Rx1 provided on the second substrate SUB2 is electrically connected with the detection circuit RC via the wiring substrate SUB3 connected to the first substrate SUB1. The detection circuit RC reads the sensor signal output from the detection electrode Rx and detects contact or approach of the object, position coordinates of the object and the like.

In the example illustrated, the contact hole V1 is formed in a circular shape in planar view, and the shape is not limited to the example illustrated but may be the other shape such as an elliptic shape.

In the example illustrated, the terminals RT1, RT3, . . . , the pads P1, P3, . . . , the wiring lines W1, W3, . . . , and the contact holes V1, V3, . . . , of the odd-numbered detection electrodes Rx1, Rx3, . . . , are located on one end side of the non-display area NDA. In addition, the terminals RT2, RT4, . . . , the pads P2, P4, . . . , the wiring lines W2, W4, . . . , and the contact holes V2, V4, . . . , of the even-numbered detection electrodes Rx2, Rx4, . . . , are located on the other end side of the non-display area NDA. In this layout, a width on one end side and a width on the other end side in the non-display area NDA can be made equal and the frame can be suitably narrowed. In addition, the wiring lines W are connected to the detection electrodes Rx via the pads P, an area to form the wiring lines W on the second substrate SUB2 is not required by forming the wiring lines W connected to the detection electrodes Rx on the first substrate SUB1 side, an area to dispose the other members can be expanded and the degree of freedom in the layout of the shape of the second substrate SUB2 can be increased.

As illustrated in the drawing, the wiring line W1 is disposed to bypass the inside of the pad P3 (i.e., the side close to the display area DA) and to be arranged on the inside of the wiring line W3 between the pad P3 and the wiring substrate SUBS, in the layout in which the pad P3 is closer to the wiring substrate SUB3 than the pad P1. Similarly, the wiring line W2 is disposed to bypass the inside of the pad P4 and to be arranged on the inside of the wiring line W4 between the pad P4 and the wiring substrate SUB3.

Figure 2:
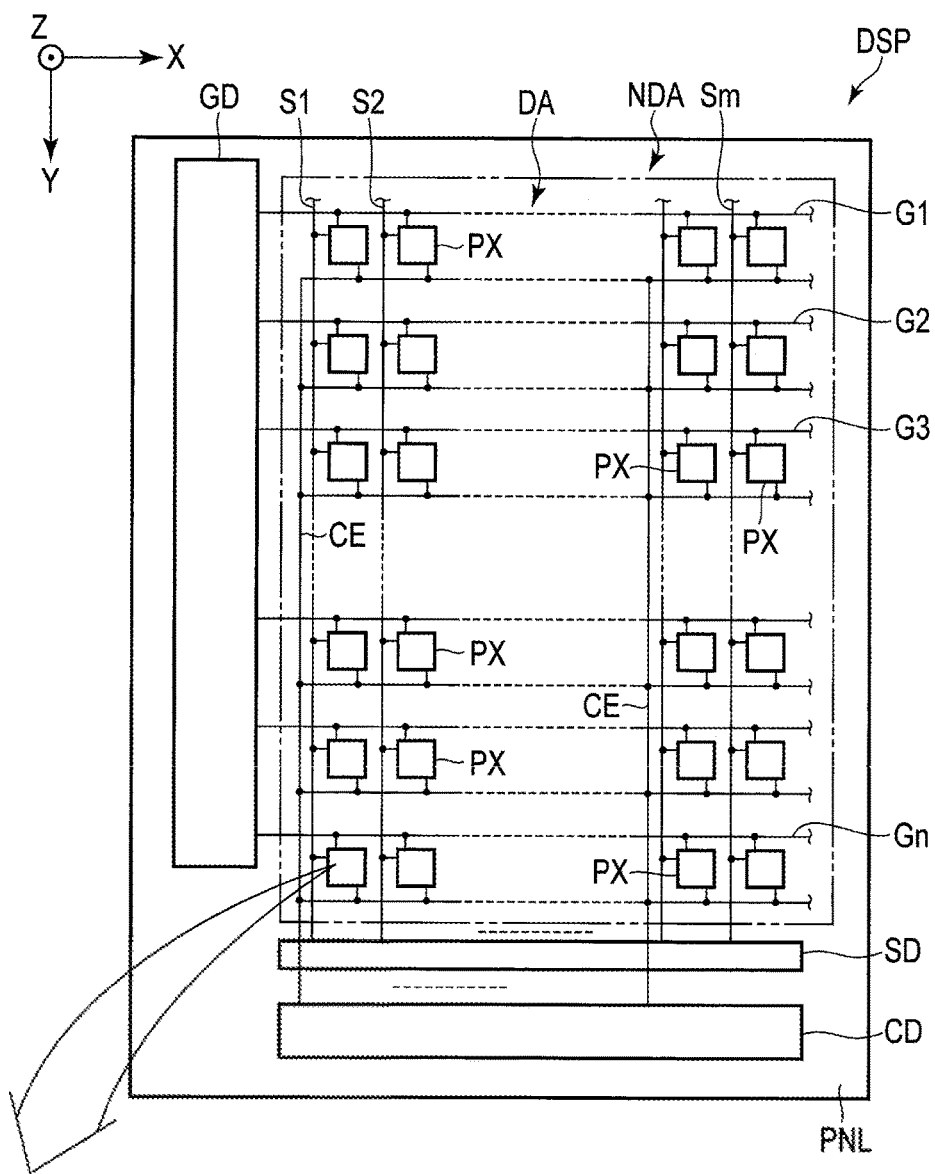
FIG. 2 is a diagram showing a basic configuration and an equivalent circuit, of the display panel shown in FIG. 1.
Figure 2:
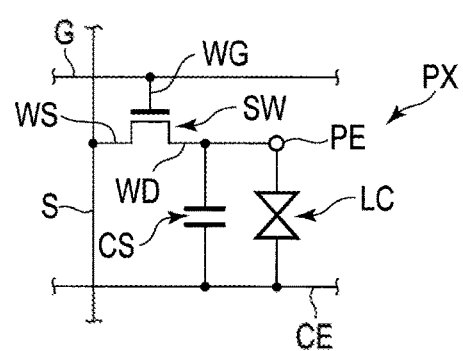

FIG. 2 is a diagram showing a basic configuration and an equivalent circuit, of the display panel PNL shown in FIG. 1.

The display panel PNL comprises a plurality of pixels PX in the display area DA. The pixel indicates a minimum unit which can be controlled independently in accordance with the pixel signal and exists in a region including, for example, switching elements disposed at positions where scanning lines and signal lines to be explained later intersect. The pixels PX are arrayed in a matrix in the first direction X and the second direction Y. In addition, the display panel PNL comprises a plurality of scanning lines G (G1 to Gn), a plurality of signal lines S (S1 to Sm), a common electrode CE and the like in the display area DA. The scanning lines G extend in the first direction X and are arranged in the second direction Y. The signal lines S extend in the second direction Y and are arranged in the first direction X. The scanning lines G and the signal lines S may not extend linearly but may be bent partially. The common electrode CE is arranged across the pixels PX. Each of the scanning lines G, the signal lines S, and the common electrode CE is drawn to the non-display area NDA. In the non-display area NDA, the scanning lines G are connected to a scanning line drive circuit GD, the signal lines S are connected to a signal line drive circuit SD, and the common electrode CE is connected to a common electrode drive circuit CD. The signal line drive circuit SD, the scanning line drive circuit GD, and the common electrode drive circuit CD may be formed on the first substrate SUB1 or several parts or all the parts of the circuits may be built in the IC chip I1 shown in FIG. 1.

Each pixel PX comprises a switching element SW, a pixel electrode PE, the common electrode CE, a liquid crystal layer LC, and the like. The switching element SW is formed of, for example, a thin-film transistor (TFT) and is electrically connected to the scanning line G and the signal line S. More specifically, the switching electrode SW comprises a gate electrode WG, a source electrode WS, and a drain electrode WD. The gate electrode WG is electrically connected to the scanning line G. In the example illustrated, the electrode electrically connected with the signal line S is called the source electrode WS and the electrode electrically connected with the pixel electrode PE is called the drain electrode WD.

The scanning line G is connected to the switching element SW of each of the pixels PX which are arranged in the first direction X. The signal line S is connected to the switching element SW of each the pixels PX which are arranged in the second direction Y. Each of the pixel electrodes PE is opposed to the common electrode CE, and drives the liquid crystal layer LC by an electric field generated between the pixel electrode PE and the common electrode CE. A storage capacitor CS is formed, for example, between the common electrode CE and the pixel electrode PE.

Figure 3:
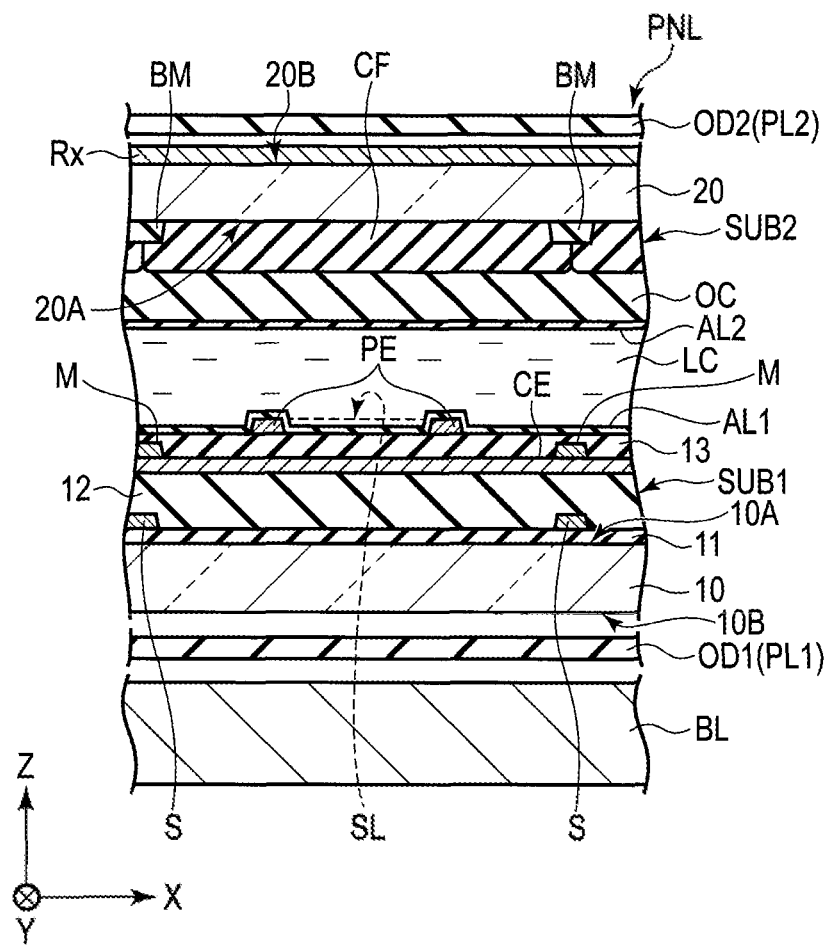
FIG. 3 is a cross-sectional view showing a partial configuration of the display panel shown in FIG. 1.

FIG. 3 is a cross-sectional view showing a partial structure of the display panel PNL shown in FIG. 1. In the cross-sectional view, the display device DSP is sectioned in the first direction X. The first substrate SUB1 and the second substrate SUB2 are opposed to each other in the third direction Z.

In the following explanation, a direction from the first substrate SUB1 toward the second substrate SUB2 is referred to as upward (or merely above), and a direction from the second substrate SUB2 toward the first substrate SUB1 is referred to as downward (or merely below). A view from the second substrate SUB2 to the first substrate SUB1 is called a planar view.

The display panel PNL illustrated in the drawing has a structure corresponding to a display mode which mainly uses a lateral electric field approximately parallel to the substrate surface. The display panel PNL may be configured to correspond to a display mode using a longitudinal electric field perpendicular to the surface of the substrate, an electric field inclined to the surface of the substrate or a combination of these electric fields. In the display mode using the lateral electric field, for example, a structure comprising both the pixel electrode PE and the common electrode CE on either of the first substrate SUB1 and the second substrate SUB2 can be applied. In the display mode using the lateral electric field or the inclined electric field, for example, a structure comprising either of the pixel electrode PE and the common electrode CE on the first substrate SUB1 and comprising the other of the pixel electrode PE and the common electrode CE on the second substrate SUB2 can be applied. The substrate surface is a surface parallel to the X-Y plane.

The first substrate SUB1 comprises the first basement 10, the signal lines S, the common electrode CE, the metal layer M, pixel electrodes PE, a first insulating layer 11, a second insulating layer 12, a third insulating layer 13, a first alignment film AL1, and the like. The switching elements, scanning lines, and various insulating layers interposed between the elements and lines are not illustrated.

The first basement 10 has a surface 10A opposed to the second substrate SUB2 and a surface 10B on a side opposite to the surface 10A. The first insulating layer 11 is located on the surface 10A of the first basement 10. The signal lines S are located on the first insulating layer 11. The second insulating layer 12 is located on the signal lines S and the first insulating layer 11. The common electrode CE is located on the second insulating layer 12. The metal layer M is in contact with the common electrode CE, directly above the signal lines S. In the example illustrated, the metal layer M is located on the common electrode CE but may be located between the common electrode CE and the second insulating layer 12. The third insulating film 13 is located on the common electrode CE and the metal layer M. The pixel electrodes PE are located on the third insulating layer 13. The pixel electrode PE is opposed to the common electrode CE via the third insulating layer 13. In addition, each pixel electrode PE comprises a slit SL at a position opposed to the common electrode CE. The first alignment film AL1 covers the pixel electrodes PE and the third insulating layer 13.

The constitution of the first substrate SUB1 is not limited to the example illustrated but the pixel electrodes PE may be located between the second insulating layer 12 and the third insulating layer 13 and the common electrode CE may be located between the third insulating layer 13 and the first alignment film AL1. In this case, the pixel electrodes PE are shaped in a flat plate including no slits while the common electrode CE includes slits opposed to the pixel electrodes PE. In addition, the pixel electrodes PE and the common electrode CE may be shaped in combs and disposed to be engaged with each other.

The second substrate SUB2 comprises a second basement 20, a light-shielding layer BM, a color filter CF, an overcoat layer OC, a second alignment film AL2, and the like.

The second basement 20 has a surface 20A opposed to the first substrate SUB1 and a surface 20B on a side opposite to the surface 20A. The light-shielding layer BM and the color filter CF are located on the surface 20A of the second basement 20. The light-shielding layer BM sections the pixels and are located directly above the signal lines S. The color filter CF is opposed to the pixel electrode PE and partially covered with the light shielding layer BM. The color filter CF includes a red color filter, a green color filter and a blue color filter. The overcoat layer OC covers the color filter CF. The second alignment film AL2 covers the overcoat layer OC.

The color filter CF may be disposed on the first substrate SUB1. The color filter CF may include color filters of four or more colors. On a pixel displaying a white color, a white color filter or an uncolored resin material may be disposed or the overcoat layer OC may be disposed without disposing the color filter.

A detection electrode Rx is located on the surface 20B of the second basement 20. The detection electrodes Rx correspond to the second conductive layer L2, may be composed of a conductive layer containing a metal, formed of a transparent conductive material such as ITO or IZO, formed by depositing a transparent conductive layer on a conductive layer containing a metal, or formed of a conductive organic material or a dispersing element of a fine conductive substance, and the like.

A first optical element OD1 including a first polarizer PL1 is located between the first basement 10 and an illumination device BL. A second optical element OD2 including a second polarizer PL2 is located on the detection electrodes Rx. Each of the first optical element OD1 and the second optical element OD2 may include a retardation film as needed.

The first glass substrate 10 and the second glass substrate 20 may be formed of, for example, an insulating material such as alkali-free glass or formed of a resin material. The scanning lines, the signal lines S, and the metal layer M are formed of metals such as molybdenum, tungsten, titanium and aluminum and may be formed in a single-layer structure or a multi-layer structure. For example, the scanning lines G are formed of a metal material containing molybdenum and tungsten, the signal lines S are formed of a metal material containing aluminum and titanium, and the metal layer M is formed of a metal material containing aluminum and molybdenum. The common electrode CE and the pixel electrodes PE are formed of a transparent conductive material such as ITO or IZO. The first insulating layer 11 and the third insulating layer 13 are inorganic insulating layers while the second insulating layer 12 is an organic insulating layer.

Next, a configuration example of the sensor SS built in the display device DSP of the embodiments will be explained. The sensor SS explained below is, for example, a capacitive sensor of a mutual-capacitive type, which detects contact or approach of an object, based on the variation in electrostatic capacitance between a pair of electrodes opposed via a dielectric.

FIG. 4 is a plan view showing a configuration example of the sensor SS.

In the configuration example illustrated, the sensor SS comprises sensor drive electrodes Tx and the detection electrodes Rx. In the example illustrated, the sensor drive electrodes Tx correspond to portions represented by downward-sloping hatch lines and are provided on the first substrate SUB1. In addition, the detection electrodes Rx correspond to portions represented by upward-sloping hatch lines and are provided on the second substrate SUB2. The sensor drive electrodes Tx and the detection electrodes Rx intersect each other in the X-Y plane. The detection electrodes Rx are opposed to the sensor drive electrodes Tx in the third direction Z.

The sensor drive electrodes Tx and the detection electrodes Rx are located in the display area DA and several parts of the electrodes extend to the non-display area NDA. In the example illustrated, the sensor drive electrodes Tx are formed in a strip shape extending in the second direction Y and arranged so as to be spaced apart from each other in the first direction X. The detection electrodes Rx extend in the first direction X and are arranged so as to be spaced apart in the second direction Y. The detection electrodes Rx are connected to the pads provided on the first substrate SUB1 and electrically connected to the detection circuit RC via the wiring lines as explained with reference to FIG. 1. Each of the sensor drive electrodes Tx is electrically connected with the common electrode drive circuit CD via a wiring line WR. The number, size and shape of the sensor drive electrodes Tx and the detection electrodes Rx are not particularly limited but can be variously changed.

The sensor drive electrode Tx comprises the common electrode CE, has a function of urging an electric field to be generated between the own electrode and the pixel electrode PE and a function of detecting the position of the object by generating the capacitance between the own electrode and the detection electrode Rx.

The common electrode drive circuit CD supplies the common drive signals to the sensor drive electrodes Tx including the common electrodes CE at the display driving time to display images in the display area DA. In addition, the common electrode drive circuit CD supplies the sensor drive signals to the sensor drive electrodes Tx at the sensing driving time to execute sensing. The detection electrodes Rx output sensor signals necessary for sensing (i.e., signals based on variation in inter-electrode capacitance between the sensor drive electrodes Tx and the detection electrodes Rx) in accordance with supply of the sensor drive signals to the sensor drive electrodes Tx. The detection signals output from the detection electrodes Rx are input to the detection circuit RC shown in FIG. 1.

The sensor SS in each of the above-explained configuration examples is not limited to the sensor of the mutual-capacitive type which detects the object based the variation in electrostatic capacitance between a pair of electrodes (in the above case, the electrostatic capacitance between the sensor drive electrodes Tx and the detection electrodes Rx).

In the example illustrated, the sensor drive electrodes Tx extend in the second direction Y and arranged in the first direction X so as to be spaced apart from each other but may extend in the first direction X and arranged in the second direction Y so as to be spaced apart from each other. At this time, the detection electrodes Rx extend in the second direction Y and are arranged in the first direction X so as to be spaced apart from each other.

Figure 5:
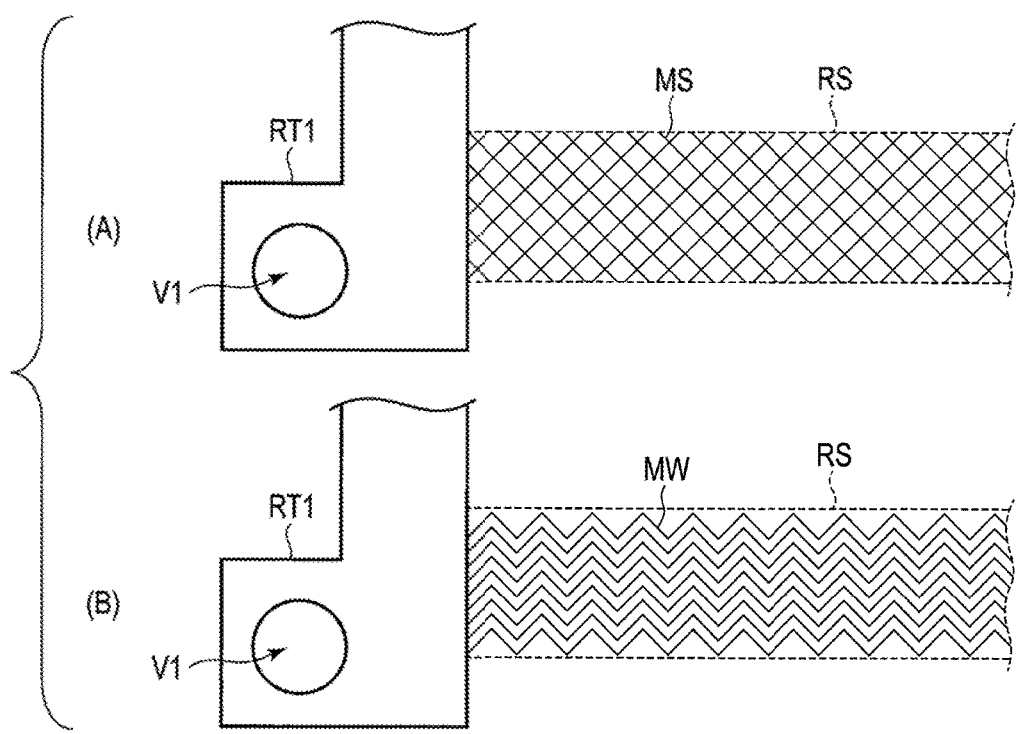
FIG. 5 is an illustration showing a configuration example of a detector in a detection electrode shown in FIG. 1.

FIG. 5 is an illustration showing a configuration example of the detector RS in the detection electrode Rx1 shown in FIG. 1.

In the example shown in FIG. 5(A), the detector RS is formed of mesh-shaped metal wires MS. The metal wires MS are joined to the terminal RT1. In the example shown in FIG. 5(B), the detector RS is formed of wave-shaped metal wires MW. In the example illustrated, the metal wires MW are formed in a sawtooth shape but may be in the other shape such as a sine wave shape. The metal wires MW are connected to the terminal RT1.

The terminal RT1 is formed of, for example, the same material as the detector RS. The circular contact hole V1 is formed in the terminal RT1.

Figure 6:
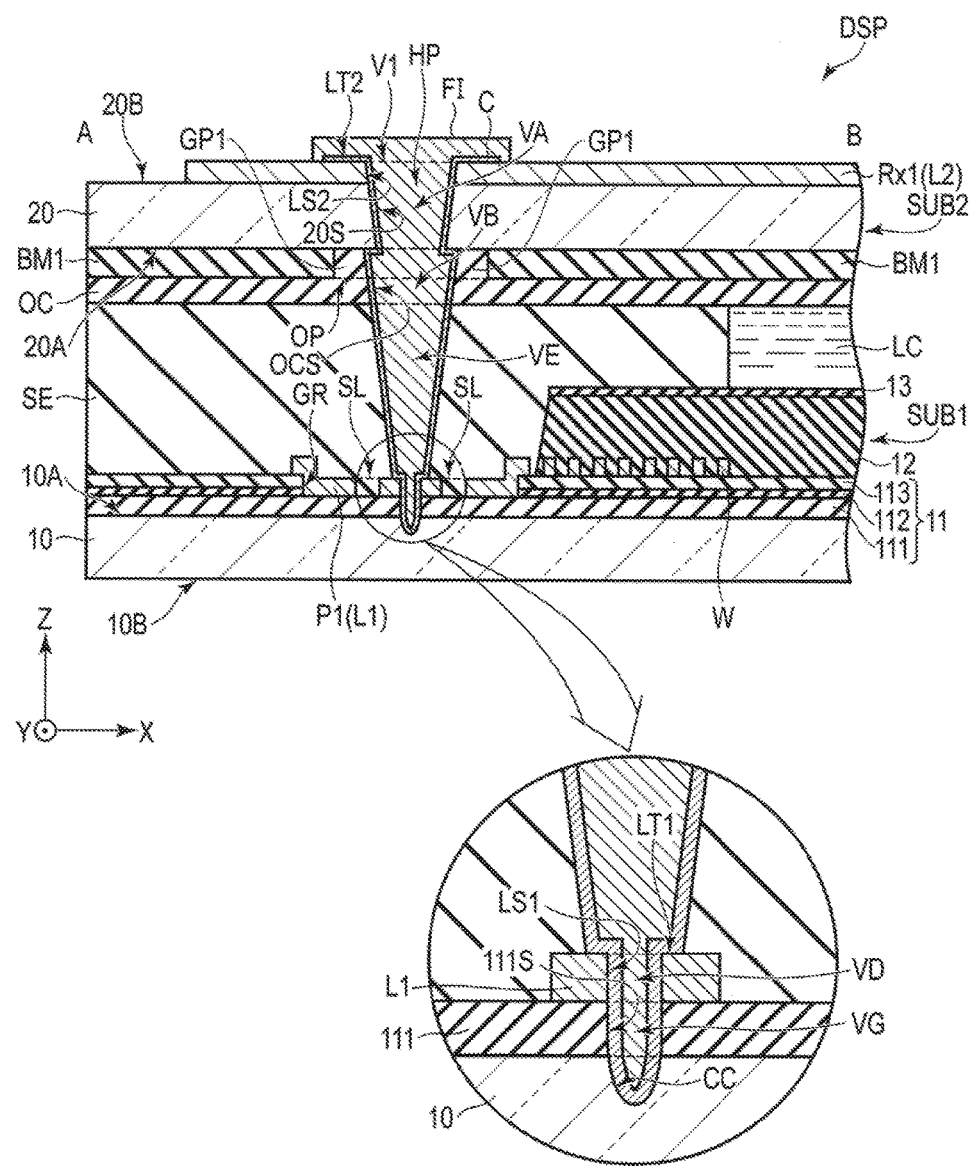
FIG. 6 is a cross-sectional view showing the display panel cut along line A-B including a contact hole shown in FIG. 1.

FIG. 6 is a cross-sectional view showing the display panel PNL cut along line A-B including the contact hole V1 shown in FIG. 1. Major portions necessary for explanations are illustrated but illustration of the first and second alignment films and the like is omitted.

In the example illustrated, the display device DSP comprises the first substrate SUB1, the second substrate SUB2, the sealant SE, the liquid crystal layer LC, the connecting material C, and a filling material FI.

The first substrate SUB1 comprises the first basement 10, the pad P1 corresponding to the first conductive layer L1, the wiring lines W, the first insulating layer 11, the second insulating layer 12, the third insulating layer 13, and the like. The pad P1 is considered as the first conductive layer L1 in the following explanations.

The first insulating layer 11 includes an insulating layer 111, an insulating layer 112, and an insulating layer 113. The insulating layer 111, the insulating layer 112, and the insulating layer 113 are deposited on the first basement 10 in this order. The first insulating layer 11 includes a concavity GR. In the example illustrated, the concavity GR penetrates the insulating layers 112 and 113 to the insulating layer 111. In addition, the semiconductor layer of the switching element is disposed between the insulating layers 111 and 112, and the scanning lines G shown in FIG. 2 are disposed between the insulating layers 112 and 113, in the display area, though not described in detail.

In the example illustrated, the first conductive layer L1 is located on the surface 10A of the first basement 10 and disposed inside the concavity GR. In other words, the first conductive layer L1 is in contact with the insulating layer 111. In addition, the wiring lines W are disposed on the insulating layer 113. The wiring lines W are located in the same layer as, for example, the signal lines formed in the display area. In the embodiments, the first conductive layer L1 is entirely formed of, for example, the same material as the signal lines S shown in FIG. 3. The first conductive layer L1 has a plurality of slits SL that are opposed to the sealant SE in the third direction Z. The second insulating layer 12 covers the wiring lines W and is also disposed on the insulating layer 113. In the example illustrated, the second insulating layer 12 is not disposed on the first conductive layer L1. The third insulating film 13 is disposed on the second insulating substrate 12.

At a position overlapping the concavity GR, the insulating layer 111 may penetrate to the first basement 10 or the first conductive layer L1 disposed in the concavity GR may be in contact with the first basement 10.

The second substrate SUB2 comprises the second basement 20, the detection electrode Rx1 corresponding to the second conductive layer L2, the light-shielding layer BM1, the overcoat layer OC, and the like. The detection electrode Rx1 is considered as the second conductive layer L2 in the following explanations.

The surface 20A of the second basement 20 is opposed to the first conductive layer L1 and is spaced apart from the first conductive layer L1. The second conductive layer L2 is located on the surface 20B of the second basement 20. Various insulating layers or various conductive layers may be disposed between the second basement 20 and the second conductive layer L2, though not illustrated in the drawing. The light-shielding layer BM1 is located between the first basement 10 and the second basement 20 and, located on the surface 20A of the second basement 20 in the embodiments. The light-shielding layer BM1 has an opening OP which penetrates to the second basement 20. The overcoat layer OC covers the light-shielding layer BM1. The overcoat layer OC is in contact with the surface 20A of the second basement 20, in the opening OP.

The sealant SE is located between the first substrate SUB1 and the second substrate SUB2. As explained above, when ultraviolet rays are applied from the lower side of the display device DSP to cure the sealant SE, ultraviolet rays can be made to reach the sealant SE since the first conductive layer L1 includes the slits SL at the positions overlapping the sealant SE. The liquid crystal layer LC is located in an area surrounded by the first substrate SUB1, the second substrate SUB2 and the sealant SE.

The first alignment film may be disposed on the sealant SE side of the first substrate SUB1, though not illustrated in the drawing. In addition, the second alignment film may be disposed on the sealant SE side of the second substrate SUB2.

A connecting structure of the first conductive layer L1 and the second conductive layer L2 of the embodiments will be explained in detail. In the second substrate SUB2, the second basement 20 includes a hole (first hole) VA penetrating between the surfaces 20A and 20B. In the example illustrated, the hole VA also penetrates the second conductive layer L2. In addition, in the second substrate SUB2, the overcoat layer OC includes a hole (second hole) VB at a position opposed to the hole VA in the third direction Z.

In contrast, in the first substrate SUB1, the first conductive layer L1 includes a hole (fourth hole) VD opposed, to the hole VA in the third direction Z. The insulating layer 111 includes a hole VG connecting with the hole VD. In addition, the sealant SE includes a hole (fifth hole) VE opposed to the hole VA in the third direction Z.

The first basement 10 includes a concavity CC which is opposed to the holes VD and VG in the third direction Z. The concavity CC, and the holes VG, VD, VE, VB, and VA are arranged in this order in the third direction Z. The concavity CC is formed from the surface 10A to the surface 10B, but does not penetrate to the surface 10B in the example illustrated. For example, a depth of the concavity CC in the third direction Z is approximately one fifth to approximately a half of the thickness of the first basement 10 in the third direction Z. The first basement 10 may include a hole penetrating between the surfaces 10A and 10B instead of the concavity CC. The holes VD and VG, and the concavity CC formed in the first substrate SUB1 are located directly under the first hole VA. The holes VA, VB, VE, VD, and VG, and the concavity CC are located in the same straight line along the third direction Z to form a contact hole V1.

The connecting material C electrically connects the first conductive layer L1 with the second conductive layer L2 via the contact hole V1. In other words, the connecting material C is provided on inner surfaces of the holes VA, VB, VE, VD, and VG, and the concavity CC. In the example illustrated, the connecting material C is in contact with each of an upper surface LT2 of the second conductive layer L2, an inner surface LS2 of the second conductive layer L2 in the hole VA, an inner surface 20S of the second basement 20 in the hole VA, and an inner surface OCS of the overcoat layer OC in the hole VB, in the second substrate SUB2. The inner surfaces LS2 and 20S form an inner surface of the hole VA.

In the example illustrated, the connecting material C is also in contact with each of an upper surface LT1 of the first conductive layer L1, an inner surface LS1 of the first conductive layer L1 in the hole VD, an inner surface 1115 of the insulating layer 111 in the hole VG, and the concavity CC, in the first substrate SUB1. The connecting material C includes a hollow HP in the holes VA, VB, VE, VD, and VG, and the concavity CC.

In the example illustrated, the connecting material C is provided on the inner surfaces of the holes VA, VB, VE, VD, and VG, and the concavity CC, but the holes may be filled with the connecting material C to bury the inside of the holes VA, VB, VE, VD, and VG, and the concavity CC. The connecting material C is formed continuously between the first conductive layer L1 and the second conductive layer L2.

In the example illustrated, the connecting material C provided in the hole VB and the light-shielding layer BM1 are spaced apart from each other. In other words, a gap GP1 is formed between the connecting material C provided in the hole VB and the light-shielding layer BM1. In the example illustrated, the overcoat layer OC is disposed in the gap GP1. The overcoat layer OC corresponds to an insulating layer which electrically insulates the connecting material C and the light-shielding layer BM1, in the gap GP1.

The gap GP1 desirably overlaps the pad P1 in the third direction Z but does not overlap the slit SL of the pad P1. Light leakage from the gap GP1 can be thereby suppressed.

The first conductive layer L1 and the second conductive layer L2 may be formed of, for example, metallic materials such as molybdenum, tungsten, titanium, aluminum, silver, copper and chromium, alloys of a combination of these metallic materials, transparent conductive materials such as indium tin oxide (ITO) and indium zinc oxide (IZO) and the like, and may be formed in a single-layer structure or a multi-layer structure. It is desirable from the viewpoint of the manufacturing process that the first conductive layer L1 is formed of, for example, metallic materials containing aluminum and is not formed of metallic materials containing materials such as molybdenum and tungsten having a higher molten point than aluminum. The connecting material C desirably contains a metallic material such as silver and also contains fine particles having the size of order of several nanometers to several tens of nanometers.

The hollow HP of the connecting material C is filled with the filling material FI. In addition, the filling material FI is also disposed on the second conductive layer L2. The filling material FI has, for example, an insulation property and is formed of an organic insulating material. The step in the third direction Z caused by forming the hollow HP in the connecting material C can be reduced by thus disposing the filling material FI. In addition, the connecting material C can be protected. In addition, the filling material FI may be conductive and may be formed by curing, for example, paste containing conductive particles of silver or the like. If the filling material FI is conductive, the filling material FI can electrically connect the first conductive layer L1 with the second conductive layer L2 even if the connecting material C is cut, and the reliability can be increased. In the embodiments, the filling material FI is formed of, for example, colored resin and is conductive. The filling material FI is formed of, for example, resin colored in black.

According to the embodiments, the gap GP1 is formed between the connecting material C provided in the hole VB and the light-shielding layer BM1, and the connecting material C and the light-shielding layer BM1 are spaced apart from each other. In addition, the overcoat layer OC serving as the insulating layer is disposed in the gap GP1. For this reason, even if the light-shielding layer BM1 is conductive, electric connection between the connecting material C and the light-shielding layer BM1 can be suppressed. Occurrence of inconvenience in the display device such as non-uniformity in display caused by making the light-shielding layer BM1 can be therefore suppressed.

In addition, according to the display device DSP comprising the above-described sensor SS, the second conductive layer L2 (detection electrode Rx) provided on the second substrate SUB2 is connected to the first conductive layer L1 (pad P) provided on the first substrate SUB1 by the connecting material C provided in the contact hole V. For this reason, a wiring substrate does not need to be mounted on the second substrate SUB2 to connect the second conductive layer L2 with the detection circuit RC. In other words, the third substrate SUB3 mounted on the first substrate SUB1 forms a transmission path to transmit a signal necessary to display an image on the display panel PNL and a transmission path to transmit a signal between the detection electrode Rx and the detection circuit RC. Therefore, the number of wiring substrates can be reduced as compared with the configuration examples which require the wiring substrates other than the wiring substrate SUB3. In addition, the non-display area of the display panel PNL, particularly, the width of the edge on which the wiring substrate SUB3 is mounted can be reduced since space to connect the wiring substrate with the second substrate SUB2 is unnecessary. The display panel can be thereby formed in a narrower frame shape.

FIG. 7 is a cross-sectional view showing another example of the display panel PNL cut along line A-B including the contact hole V1 shown in FIG. 1. The configuration example shown in FIG. 7 is different from the configuration example shown in FIG. 6 with respect to a feature that the second substrate SUB2 comprises a color filter CF1 in the gap GP1 between the connecting material C and the light-shielding layer BM1. The color filter CF1 is, for example, any one of the red color filter, the green color filter, and the blue color filter as explained with reference to FIG. 3. The color filter CF1 corresponds to an insulating layer which electrically insulates the connecting material C and the light-shielding layer BM1 in the gap GP1. For this reason, the connecting material C provided in the hole VB and the light-shielding layer BM1 are electrically insulated from each other by the color filter CF1 disposed in the gap GP1.

In the example illustrated, the second substrate SUB2 comprises a color filter CF2 deposited on the color filter CF1 on the first basement 10 side and a color filter CF3 deposited on the color filter CF2 on the first basement 10 side. The color filters CF1 to CF3 are color filters of colors different from each other. Thus, light leakage from the gap GP1 can be suppressed by depositing the color filters CF1 to CF3 at the position overlapping the gap GP1.

In the example illustrated, three color filters CF1 to CF3 are deposited but at least one color filter CF1 may be disposed in the gap GP1 from the viewpoint of electrically insulating the connecting material C and the light-shielding layer BM1. In addition, a plurality of color filters are desirably deposited, and color filters of colors having lower transmittance are desirably selected as the deposited color filters, from the viewpoint of suppressing the light leakage from the gap GP1.

FIG. 8 is a cross-sectional view showing another example of the display panel PNL cut along line A-B including the contact hole V1 shown in FIG. 1. The configuration example shown in FIG. 8 is different from the configuration example shown in FIG. 6 with respect to a feature that the second substrate SUB2 is spaced apart from the light-shielding layer BM1 and comprises a light-shielding layer BM2 which is in contact with the connecting material C.

The light-shielding layer BM2 is located between the first basement 10 and the second basement 20 and, in the embodiments, located on the surface 20A of the second basement 20 which corresponds to the same layer as the light-shielding layer BM1. The light-shielding layers BM2 is spaced apart from the light-shielding layer BM1. In other words, a gap GP2 is formed between the light-shielding layers BM1 and BM2. In the present embodiment, a width of the gap GP2 in the first direction X is approximately 10 μm. The light-shielding layers BM2 is in contact with the connecting material C. In the example illustrated, the overcoat layer OC is disposed in the gap GP2 and corresponds to an insulating layer which electrically insulates the light-shielding layers BM1 and BM2. In other words, even if the light-shielding layers BM1 and BM2 are conductive, the connecting material C and the light-shielding layer BM1 are electrically insulated from each other by the overcoat layer OC disposed in the gap GP2.

The gap GP2 desirably overlaps the pad P1 in the third direction Z but does not overlap the slit SL of the pad P1. Light leakage from the gap GP2 can be thereby suppressed.

FIG. 9 is a cross-sectional view showing another example of the display panel PNL cut along line A-B including the contact hole V1 shown in FIG. 1. The configuration example shown in FIG. 9 is different from the configuration example shown in FIG. 8 with respect to a feature that the second substrate SUB2 comprises a color filter CF1 in the gap GP2 between the light-shielding layers BM1 and BM2. The color filter CF1 corresponds to an insulating layer which electrically insulates the light-shielding layers BM1 and BM2, in the gap GP2. For this reason, the connecting material C provided in the hole VB and the light-shielding layer BM1 are electrically insulated from each other by the color filter CF1 disposed in the gap GP2.

In the example illustrated, the second substrate SUB2 comprises a color filter CF2 deposited on the color filter CF1 on the first basement 10 side. Thus, light leakage from the gap GP2 can be suppressed by depositing the color filters CF1 and CF2 at the position overlapping the gap GP2.

In the example illustrated, two color filters CF1 and CF2 are deposited but at least one color filter CF1 may be disposed in the gap GP2 from the viewpoint of electrically insulating the connecting material C and the light-shielding layer BM1. In addition, a plurality of color filters are desirably deposited, and color filters of colors having lower transmittance are desirably selected as the deposited color filters, from the viewpoint of suppressing the light leakage from the gap GP2.

FIG. 10 is a cross-sectional view showing another example of the display panel PNL cut along line A-B including the contact hole V1 shown in FIG. 1. The configuration example shown in FIG. 10 is different from the configuration example shown in FIG. 6 with respect to a feature that the first substrate SUB1 comprises a third conductive layer L3.

In the example illustrated, the second insulating layer 12 is also disposed on the first conductive layer L1. The second insulating layer 12 corresponds to an organic insulating layer disposed on the first substrate SUB1. The third conductive layer L3 is located between the second insulating layer 12 and the sealant SE. The third conductive layer L3 is electrically connected with the first conductive layer L1 via the contact hole CH which penetrates the second insulating layer 12 to the first conductive layer L1. The third conductive layer L3 includes a hole (sixth hole) VF connected to the hole VE of the sealant SE. The third conductive layer L3 is located in the same layer as the metal layer M explained with reference to FIG. 3. In the embodiments, the third conductive layer L3 is entirely formed of the same material as the metal layer M shown in FIG. 3.

In the example illustrated, the third conductive layer L3 protrudes into the contact hole V1. For this reason, the contact surface between the third conductive layer L3 and the connecting material C can be increased in the contact hole V1. Reliability of the electrical connection between the connecting material C and the first conductive layer L1 via the third conductive layer L3 can be increased.

Figure 11:
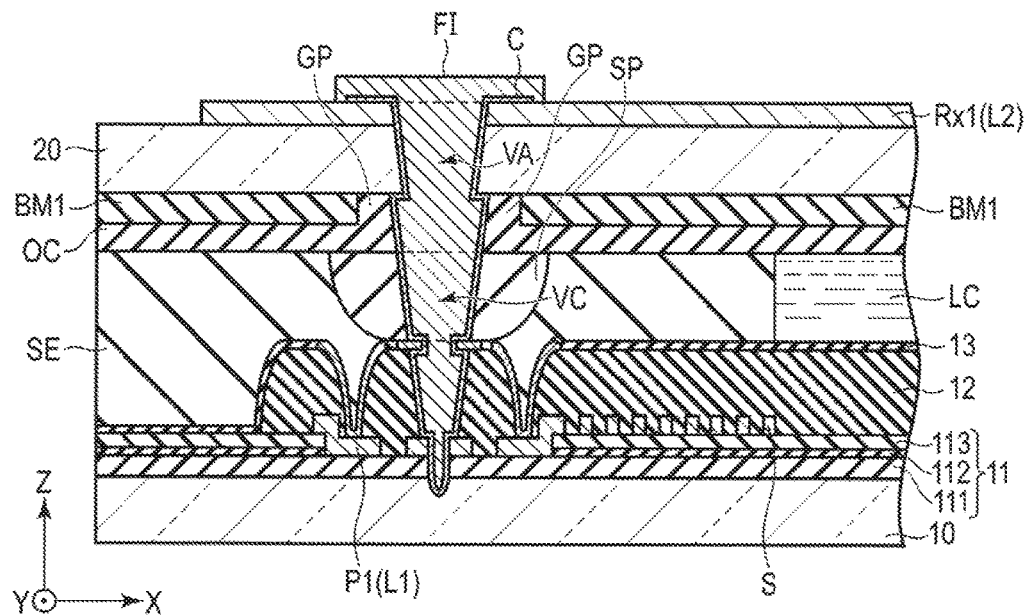
FIG. 11 is a cross-sectional view showing yet another example of the display panel cut along line A-B including the contact hole shown in FIG. 1.

FIG. 11 is a cross-sectional view showing yet another example of the display panel PNL cut along line A-B including the contact hole V1 shown in FIG. 1. The configuration example shown in FIG. 11 is different from the configuration example shown in FIG. 10 with respect to a feature that a spacer SP is formed between the first substrate SUB1 and the second substrate SUB2.

The spacer SP includes a hole (third hole) VC at a position opposed to the hole VA. The spacer SP is formed of, for example, an organic insulating material. The spacer SP may be formed in a columnar shape or formed in a wall shape extending in the second direction Y. The spacer SP may be formed integrally with the overcoat layer OC or independently of the overcoat layer OC.

In addition, in the example illustrated, the spacer SP is disposed on the second substrate SUB2 but may be disposed on the first substrate SUB1. In addition, in the example illustrated, the spacer SP is formed to be tapered from the second basement 20 side to the first basement 10 side but may be formed to be tapered from the first basement 10 side to the second basement 20 side.

Figure 12:
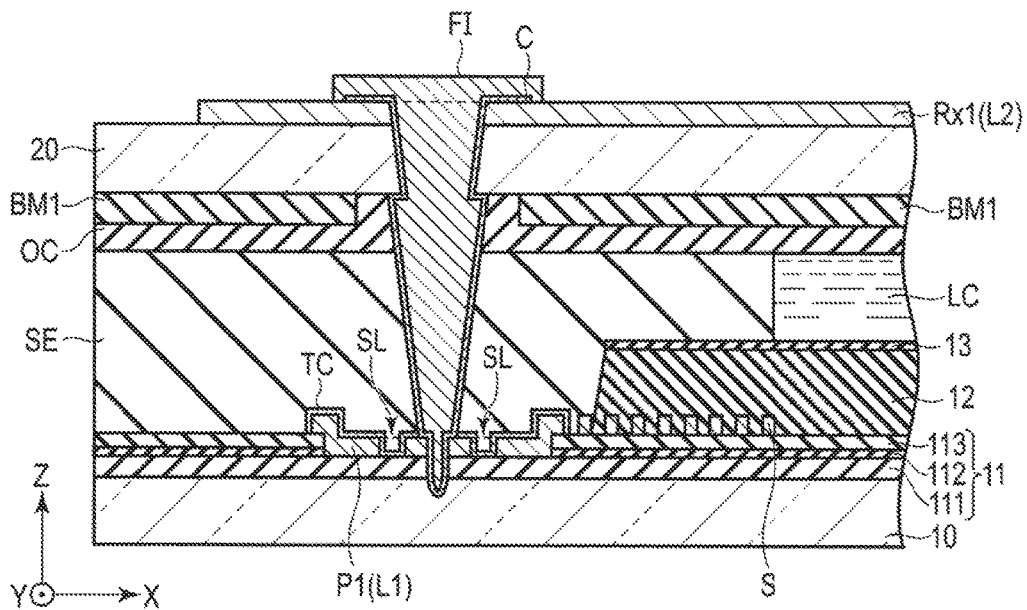
FIG. 12 is a cross-sectional view showing yet another example of the display panel cut along line A-B including the contact hole shown in FIG. 1.

FIG. 12 is a cross-sectional view showing another example of the display panel PNL cut along line A-B including the contact hole V1 shown in FIG. 1. The configuration example shown in FIG. 12 is different from the configuration example shown in FIG. 6 with respect to a feature that the first substrate SUB1 comprises a transparent conductive layer TC which covers the first conductive layer L1.

In the example illustrated, the transparent conductive layer TC is also disposed in the slits SL. The transparent conductive layer TC is formed of the same material as, for example, the pixel electrodes PE shown in FIG. 3 or the common electrode CE and formed of a transparent conductive material such as ITO or IZO. The transparent conductive layer TC functions as a protective layer which protects the first conductive layer L1 from moisture. For this reason, corrosion of the first conductive layer L1 can be suppressed.

FIG. 13 is a plan view showing a positional relationship between the hole VA and the light-shielding layer BM1 shown in FIG. 6.

FIG. 13(A) shows the light-shielding layer BM1 seen before the hole VA is formed. In the example illustrated, the light-shielding layer BM1 has an octagonal opening OP. The shape of the opening OP is not limited to the example illustrated but may be various shapes such as a circle and other polygons. FIG. 13(B) shows the light-shielding layer BM1 seen after the hole VA has been formed. The hole VA is disposed in the opening OP in planar view. In addition, the filling material FI overlaps the gap GP1 in planar view.

FIG. 14 is a plan view showing a positional relationship between the hole VA and the light-shielding layers BM1 and BM2 shown in FIG. 8.

FIG. 14(A) shows the light-shielding layers BM1 and BM2 seen before the hole VA is formed. The light-shielding layer BM2 is formed in an octagonal shape and disposed in the opening OP shown in FIG. 13(A). A gap GP2 is formed between the light-shielding layers BM1 and BM2. FIG. 14(B) shows the light-shielding layers BM1 and BM2 seen after the hole VA has been formed. The hole VA is disposed inside the gap GP2 in planar view. In addition, the filling material FI overlaps the gap GP2 in planar view.

Figure 15:
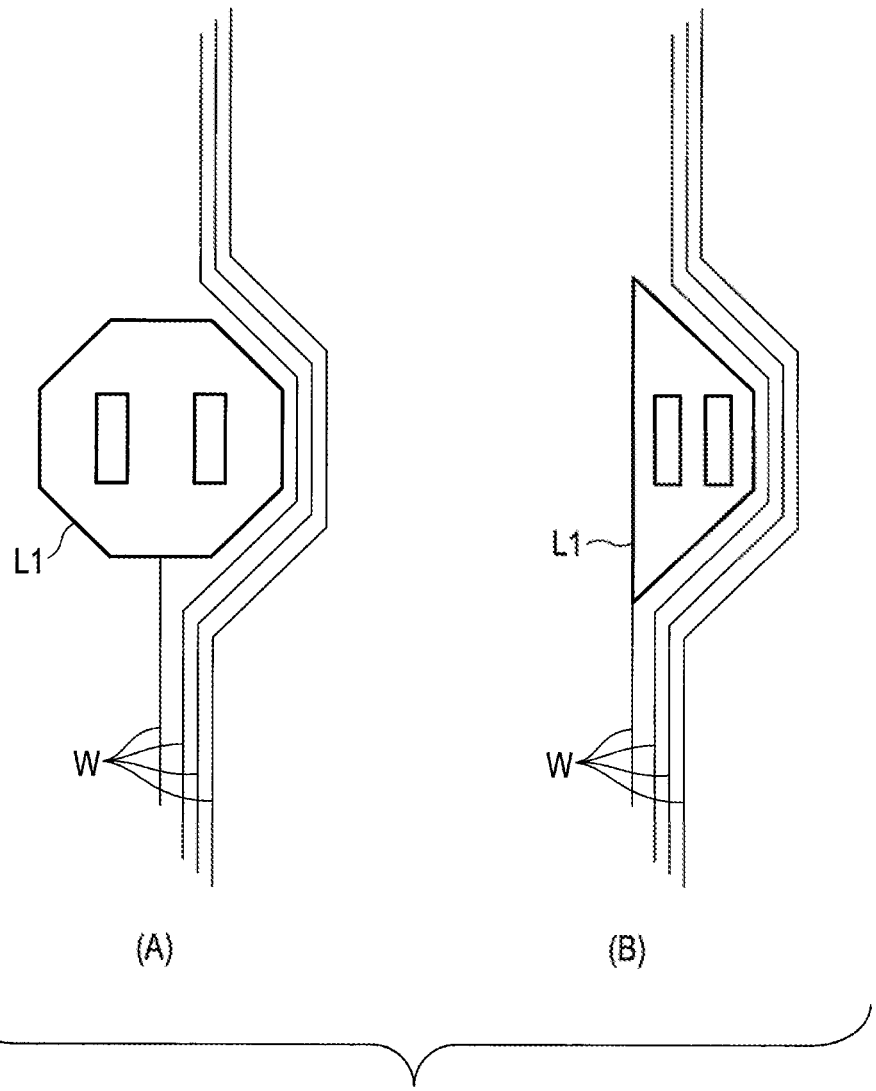
FIG. 15 is a plan view showing a shape of a pad.

FIG. 15 is a plan view showing a shape of the first conductive layer L1.

In the example shown in FIG. 15(A), the first conductive layer L1 is formed in an octagonal shape in planar view. In the example shown in FIG. 15(B), the first conductive layer L1 is formed in a trapezoid shape in planar view. As shown in FIG. 15(A) and FIG. 15(B), the wiring lines W extend on either side of the first conductive layer L1 along the shape of the first conductive layer L1.

The shape of the first conductive layer L1 is not limited to the example illustrated but may be various shapes such as a circle and other polygons.

As described above, the display device capable of thinning the frame can be obtained by the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A display device comprising:
    a first substrate comprising a first basement and a first conductive layer;
    a second substrate comprising a second basement which includes a first surface opposed to the first conductive layer and spaced apart from the first conductive layer and a second surface on a side opposite to the first surface, and a second conductive layer which is located on the second surface, and including a first hole which penetrates between the first surface and the second surface;
    a first light-shielding layer located between the first basement and the second basement; and
    a connecting material electrically connecting the first conductive layer with the second conductive layer via the first hole,
    wherein
    the connecting material and the first light-shielding layer are spaced apart from each other.

2. The display device of claim 1, further comprising:
    a second light-shielding layer located between the first basement and the second basement and spaced apart from the first light-shielding layer,
    wherein
    the second light-shielding layer is in contact with the connecting material.

3. The display device of claim 1, wherein
the display device includes a gap between the connecting material and the first light-shielding layer, and further comprises an insulating layer disposed in the gap.

4. The display device of claim 3, wherein
the insulating layer is an overcoat layer covering the first light-shielding layer.

5. The display device of claim 3, wherein
the insulating layer is a first color filter.

6. The display device of claim 5, further comprising:
    a second color filter of a color different from a color of the first color filter deposited on the first color filter on the first basement side.

7. The display device of claim 3, wherein
the insulating layer includes a second hole at a position opposed to the first hole.

8. The display device of claim 1, wherein
the connecting material includes a hollow in the first hole, and
the display device further comprises a filling material which buries the hollow and which is formed of colored resin.

9. The display device of claim 8, wherein
the filling material is conductive.

10. The display device of claim 8, wherein
the display device includes a gap between the connecting material and the first light-shielding layer, and
the filling material is also disposed on the second conductive layer and overlaps the gap in planar view.

11. The display device of claim 1, further comprising:
    a spacer between the first basement and the second basement,
    wherein
    the spacer includes a third hole at a position opposed to the first hole.

12. The display device of claim 11, wherein
the spacer is formed in a shape of a column or a wall.

13. The display device of claim 11, wherein
the spacer is formed on the second substrate.

14. The display device of claim 1, wherein
the first conductive layer is formed in a trapezoid shape or an octagonal shape in planar view.

15. The display device of claim 1, further comprising:
    a signal line disposed in a display area in which an image is displayed,
    wherein
    the first conductive layer is disposed in a non-display area surrounding the display area and is formed of a same material as the signal line.

16. The display device of claim 1, wherein
the first conductive layer is covered with a transparent conductive layer.

17. The display device of claim 16, further comprising:
    a pixel electrode and a common electrode disposed on the first substrate,
    wherein
    the transparent conductive layer is formed of a same material as the pixel electrode or the common electrode.

18. The display device of claim 1, wherein
the first conductive layer includes a fourth hole opposed to the first hole, and
the connecting material is in contact with an upper surface of the first conductive layer and an inner surface in the fourth hole.

19. The display device of claim 18, wherein
the first basement includes concavity opposed to the fourth hole, and the connecting material is in contact with concavity.

20. The display device of claim 1, further comprising:
an organic insulating layer disposed on the first substrate;
a sealant bonding the first substrate to the second substrate; and
a third conductive layer located between the organic insulating layer and the sealant and electrically connected with the first conductive layer,
wherein
the sealant includes a fifth hole opposed to the first hole, and the third conductive layer includes a sixth hole connected to the fifth hole.

* * * * *